(12) United States Patent
Azimi et al.

(10) Patent No.: US 6,259,311 B1
(45) Date of Patent: Jul. 10, 2001

(54) METHOD AND APPARATUS FOR TUNING FILTERS

(75) Inventors: Kouros Azimi, West Chester; Dale Harvey Nelson, Shillington, both of PA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/219,800

(22) Filed: Dec. 23, 1998

(51) Int. Cl.[7] ...................................................... H03K 5/00
(52) U.S. Cl. .............................................................. 327/553
(58) Field of Search ................................ 327/552, 553–559, 327/344; 330/305

(56) References Cited

U.S. PATENT DOCUMENTS

| | | | |
|---|---|---|---|
| 5,345,119 | * 9/1994 | Khoury | 327/553 |
| 5,416,438 | * 5/1995 | Shibata | 327/553 |
| 5,742,579 | 4/1998 | Kazuno et al. | 369/124 |

* cited by examiner

*Primary Examiner*—Dinh T. Le
(74) *Attorney, Agent, or Firm*—William H. Bollman

(57) ABSTRACT

A highly accurate tuning circuit for a tunable filter is provided which trims an RC time constant based on variances in both a formed capacitive component as well as variances in formed resistive components. A capacitor and resistor based tuning control circuit includes both a formed capacitor based tuning reference current generator and a formed resistor based tuning voltage reference generator. Each generates a voltage reference which is compared to the other to determine control signals for tuning a tunable resistive component forming the resistive portion of the RC time constant of the relevant filter. The resistive component is tuned by shorting selective resistors in the tunable resistive component. By tuning the RC time constant to the particular variances in capacitor and resistor components formed in the integrated circuit, the RC time constant of the tunable filter can be tuned to a desired absolute value within a tighter tolerance range than was previously available with conventional tuning circuits which provided tuning control based only on the variances of formed resistor elements.

35 Claims, 10 Drawing Sheets

502

520

600

METHOD AND APPARATUS FOR TUNING FILTERS

BACKGROUND OF THE INVENTION

1. Field of the Invention

This invention relates generally to tuned filters. More particularly, it relates to a tuning method and apparatus which provides high absolute accuracy in an RC time constant of an integrated circuit filter.

2. Background of Related Art

It is known that process variation in the tolerance of the absolute value of individual components formed in an integrated circuit (e.g., resistors and/or capacitors) can be quite great, but that similar components can be matched quite closely in value because it is likely that both will be affected equally by process and/or temperature variations. Thus, individual integrated circuit resistors can typically be manufactured to have a value only within a large range or tolerance.

One method to overcome this problem is the use of matched components. However, in certain applications such as where the absolute value of an RC time constant is important, the tolerance in the resistance and/or capacitance value providing the RC time constant dictates the accuracy of any filter basing its operation thereon. The accuracy of an RC time constant and thus a filter based thereon can be improved significantly by in-circuit tuning of the resistance forming the RC time constant to compensate for fluctuations in process and/or temperature.

A continuous time filter is a traditional technique, useful for removing high frequency out-of-band power of a signal (e.g., above 2 times the Nyquist rate). A continuous time filter is particularly useful in a circuit including sampling by an analog-to-digital (A/D) converter to provide higher accuracy in the samples. The present inventors desired to provide a more accurately tuned continuous time filter than those presently available using resistor based tuning.

Some applications, e.g., a central office codec used to digitize telephone speech, will use a switched capacitor filter switched at a high speed, e.g., 1 megahertz (MHz) to achieve a desired band pass (e.g., 4 kilohertz (kHz) band pass) together with a continuous time filter (e.g., a smoothing filter) having a wide tolerance due to the large tolerance of certain components such as resistors and/or capacitors forming an RC time constant therein. Such applications typically use both a band pass filter and a continuous time filter having low tolerance requirements, e.g., in the neighborhood of 35 kHz.

FIGS. 6 to 10 show a conventional technique for tuning the resistive portion of an RC time constant in a continuous time filter based on the variances of formed resistors only.

In particular, FIG. 6 shows a block diagram of an embodiment of a conventionally tuned continuous time filter operating on an input signal 410 to provide an output signal 420. A filter 600, e.g., a continuous time filter, filters an input signal 410 to provide an appropriately filtered output signal 420. The response of the filter 600 is controlled by one or more RC time constant(s). To provide the desired accuracy, the filter 600 is tuned by hand with a trimmed current source resistor tuning control circuit 400.

FIG. 7 is a schematic depiction of an embodiment of the conventionally tuned filter 600 shown in FIG. 6.

In particular, the trimmed current source resistor tuning control circuit 400 includes a trimmed current portion 502, and a comparators and latches portion 520. A relevant segment of the filter 600 is also shown in FIG. 7, as are the input signal 410 and the output signal 420.

The trimmed current portion 502 of the trimmed current source resistor tuning control circuit 400 includes a current mirror formed by two p-channel metal oxide semiconductor field effect transistors (PMOSFETs) 532, 534. A first side of the current mirror is trimmed with a current trimming element 536 (e.g., a variable resistor) to provide a desired current through the MOSFET 532. The current value set in this first side of the current mirror is then duplicated in the other side of the current mirror circuit, i.e., through MOSFET 534. The duplicated current is driven through a plurality of series connected resistors, e.g., four resistors 504, 506, 508 and 510.

Three comparators 522, 524 and 526 are fed on their respective positive inputs by nodes between each of the respective resistors 508 and 506, 506 and 504, and above resistor 504. The negative input of each of the three comparators 522, 524 and 526 is tied to a desired reference voltage VREF. The reference voltage VREF may be either internally generated on the integrated circuit or externally provided to the trimmed current source resistor tuning control circuit 400 from a source external to the integrated circuit.

The outputs of the comparators 522, 524 and 526 are respectively latched by latches 542, 544 and 546. The outputs of the comparators 522, 524 and 526 control the switching in or out of individual resistor in a tunable resistor element in the filter 600.

For example, tunable resistor components 613, 615 in the segment of the filter 600 shown in FIG. 7 are adjusted or 'tuned' in accordance with the state of the outputs of the latches 542, 544 and 546. For instance, if the voltage reference VREF is at a level such that comparator 526 is saturated (i.e., the voltage level of the node between resistors 508 and 506 is greater than that of the voltage reference VREF), then latch 546 would have an active output thus turning on respective MOSFET switches 653a and 653b in the tunable filter 600, and accordingly short resistor 634 in the first resistive component 613 and resistor 644 in the balanced resistive component 615. Accordingly, the resistive components 613 and 615 (which are the balanced resistive portions of an RC time constant in the filter 600) are tuned within the allowable tolerance to the resistance of formed resistors 631–633 and 641–643, respectively, based on the performance of resistors 504–510 formed in the trimmed current portion 502.

Similarly, if the resistors 504–510 in the trimmed current portion 502 are such that a voltage level between resistors 506 and 504 exceeds that of the voltage reference VREF, then latches 544 and 546 have active outputs to cause closure of MOSFET switches 653a, 653b, 652a and 652b, to tune the resistive components 613 and 615 to the values of resistors 631–632 and 641–642, respectively. If the formed resistors 504–510 are such that the voltage level above the resistor 504 exceeds that of the voltage reference, then all three comparators 522–526 will become saturated and all three latches 542–546 will have active outputs when enabled, thus shorting all resistors except for resistor 631 in the first resistive element 613 and except for resistor 641 in the second resistive element 615.

For completeness, more detailed schematics of an embodiment of the conventional tunable continuous time filter shown in FIG. 6 are shown in FIGS. 8 to 10. In particular, FIG. 8 is a schematic diagram of the trimmed current portion 502 of the embodiment of the trimmed current source resistor tuning control circuit 400 shown in FIGS. 6 and 7. FIG. 9 is a schematic diagram of the comparators and latches portion 520 of the trimmed current source resistor tuning control circuit 400 shown in FIGS. 6 to 8. FIG. 10 is a schematic diagram of the filter 600 shown in FIG. 6.

Accordingly, FIGS. 6–10 show a conventional technique wherein a tunable resistor portion of an RC time constant in a filter 600 can be tuned based on formed resistors and a trimmed current. However, such conventional resistance-only based designs do not provide the desired precision or tolerance in the tuned filter, largely because variances in the other portion of the RC time constant, i.e., in the capacitive portions still leave a significant amount of error in the absolute value of the RC time constant. Moreover, many integrated circuit technologies do not allow for the manufacture of high density capacitors necessary for switched capacitor techniques.

Untuned filters in these technologies would likely have +/−50% tolerance. Even techniques based only on resistor tuning can reduce the variation to only approximately +/−25%.

Thus, there is a need for a tuning circuit for a continuous time filter which allows more accurate tuning of the RC time constant of a filter such that variances in both the resistor and the capacitor in the RC time constant are compensated for.

SUMMARY OF THE INVENTION

In accordance with the principles of the present invention, a control circuit for tuning a filter comprises a capacitor based tuning reference current generator, a resistor based tuning reference voltage generator, and a combining circuit to combine reference signals output from the capacitor based tuning reference generator and the resistor based tuning reference generator to provide at least one control signal to tune the filter.

A method of tuning a filter in accordance with another aspect of the present invention comprises forming a capacitor based tuning reference generator including a first capacitance in an integrated circuit. A first resistance is formed in the integrated circuit. A second capacitance and a second resistance are formed in combination to form an RC combination. One of the second capacitance and the second resistance is tuned based on a signal from the first capacitance and a signal from the first resistance.

BRIEF DESCRIPTION OF THE DRAWINGS

Features and advantages of the present invention will become apparent to those skilled in the art from the following description with reference to the drawings, in which:

FIG. 6 shows a block diagram of the conventional resistor based tuning control circuit and tunable filter.

FIG. 7 is a schematic depiction of a conventional resistor based tuning control circuit shown in FIG. 6.

FIG. 8 is a schematic diagram of the conventional trimmed current portion of the trimmed current source resistor tuning control circuit shown in FIGS. 6 and 7.

FIG. 9 is a schematic diagram of the conventional comparators and latches portion of the trimmed current source resistor tuning control circuit shown in FIGS. 6 to 8.

FIG. 10 is a schematic diagram of the conventional tunable filter shown in FIGS. 6 to 9.

DETAILED DESCRIPTION OF ILLUSTRATIVE EMBODIMENTS

The present invention provides a highly accurate tuning circuit for a tunable filter which sets an RC time constant in the tunable filter based on the absolute value of a formed capacitive component as well as on the absolute values of formed resistive components. A capacitor and resistor based tuning control circuit includes both a formed capacitor based tuning voltage reference generator and a formed resistor based tuning voltage reference generator. The two resultant voltage references are compared to one another to determine control signals for switching in or out any of a plurality of individual resistors in a tunable resistive component forming the resistive portion of the RC time constant of the relevant tunable filter. By tuning the RC time constant based on variances in similarly formed capacitor and resistor components, the RC time constant of the tunable filter can be more accurately tuned to a desired absolute value within a tighter tolerance range than was previously available with conventional tuning circuits which provided a tuning signal based only on formed resistor elements or only on formed capacitive elements.

Thus, the present invention provides a method and apparatus for compensating for process and temperature variations in capacitor formation in an integrated circuit as well as in resistor formation, as opposed to the conventional tuning techniques which compensated for variations in resistor formation or capacitor formation only. The present invention, while applicable in a wide variety of tunable circuits, has particular application in circuits wherein the absolute values of a resistance and capacitance are important, e.g., in a filter having an RC time constant.

Figure 1:
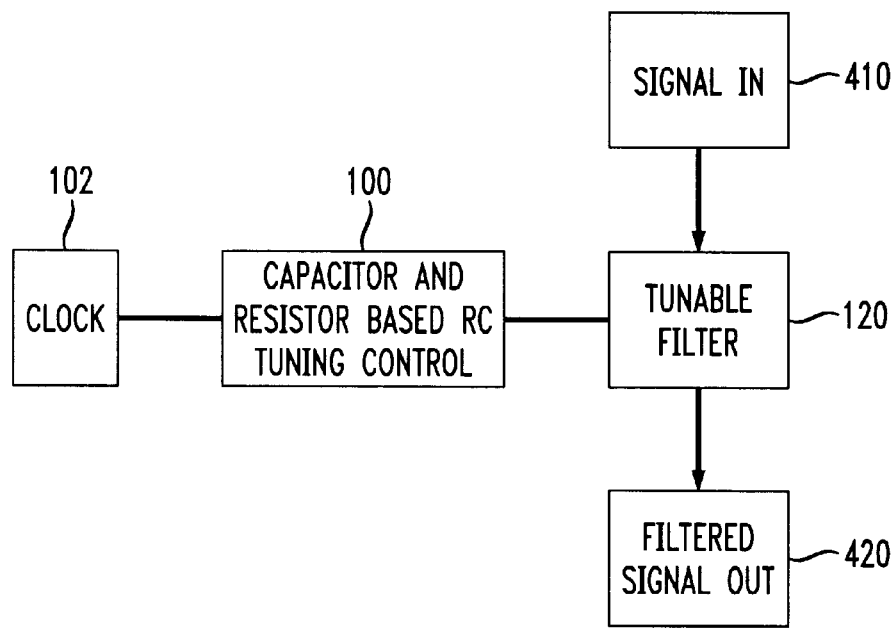
FIG. 1 shows a block diagram of an embodiment of an RC tuning control circuit and tunable filter, in accordance with the principles of the present invention.

FIG. 1 shows a block diagram of an embodiment of a tunable filter tuned in accordance with the principles of the present invention.

In particular, in FIG. 1, an input signal 410 is filtered in the base band by a tunable filter 120 using a capacitor and resistor based RC tuning control circuit 100. The tunable filter 120 is preferably a continuous time filter such as, e.g., an anti-aliasing filter useful in combination with sampling circuits.

Figure 2:
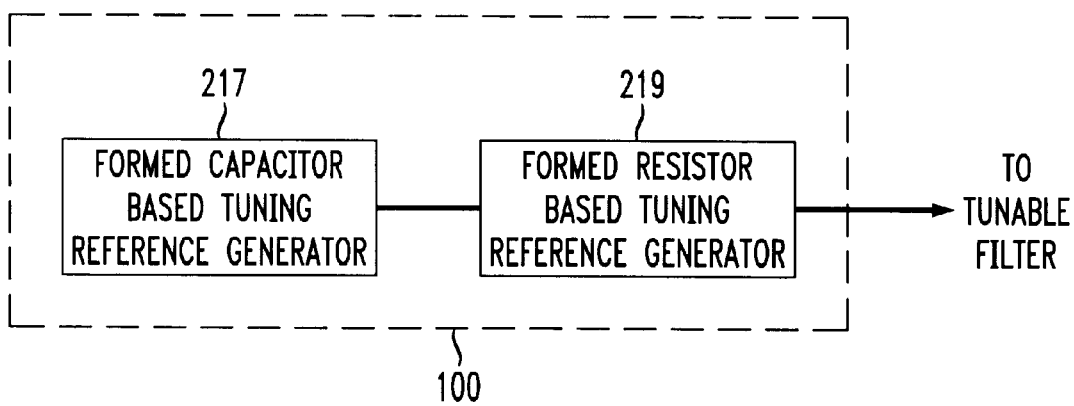
FIG. 2 shows a block diagram of a capacitor and resistor based resistor tuning control circuit shown in FIG. 1.

FIG. 2 shows a more detailed block diagram of the capacitor and resistor based RC tuning control circuit 100 shown in FIG. 1.

In FIG. 2, the capacitor and resistor based RC tuning control circuit 100 includes both a formed capacitor based tuning reference voltage generator 217 and a formed resistor based tuning reference voltage generator 219. Respective reference voltages from both the formed capacitor based tuning reference voltage generator 217 and from the formed resistor based tuning reference voltage generator 219 combine to provide suitable tuning control signals for use by the tunable portion of an RC time constant in a relevant tunable filter. The respective reference voltages may be combined in any suitable fashion, e.g., in parallel using a comparison device, or in series by cumulatively combining the respective reference voltages such that one reference voltage generator 217 or 219 feeds an output to the other reference voltage generator 219 or 217.

Figure 3:
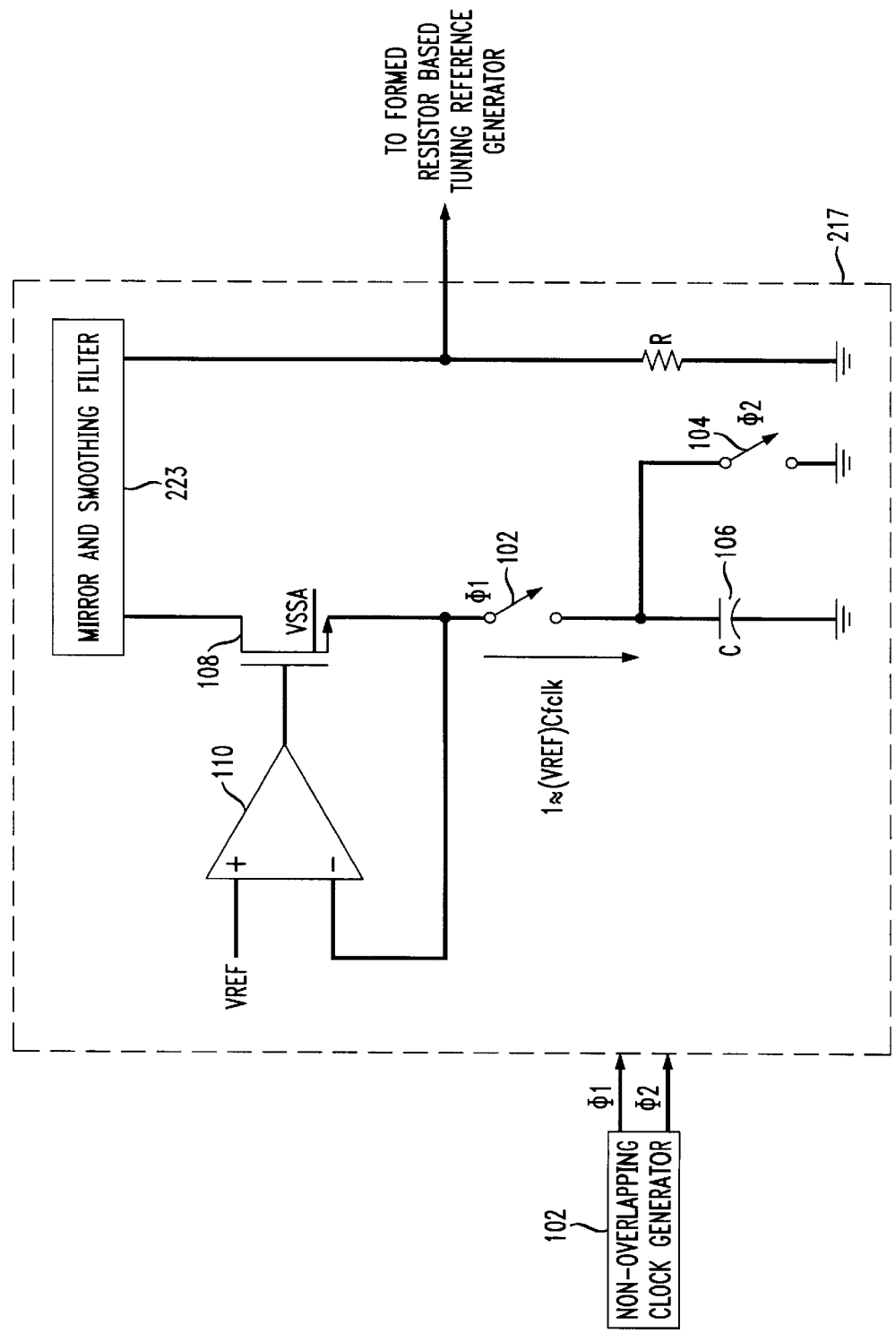
FIG. 3 is a schematic depiction of an embodiment of the formed capacitor based tuning reference generator shown in FIG. 2.

FIG. 3 is a schematical depiction of the formed capacitor based tuning reference voltage generator 217 shown in FIG. 2.

In FIG. 3, a formed capacitor 106 is alternately charged to a reference voltage level VREF, and then discharged to ground (e.g., an analog ground), based on the cycles of a reference clock signal. One phase Φ1 of a clock signal output from a non-overlapping reference clock generator 102 controls a charging switch 102 (e.g., a MOSFET), while an opposite phase Φ2 (e.g., 180 degrees out of phase with the first phase Φ1) of the clock signal controls a discharge switch 104 (e.g., another MOSFET).

The voltage reference VREF preferably has a +/−10% or greater if internally generated, or a +/−2% to +/−5% tolerance if generated external to the integrated circuit.

The formed capacitor 106 provides a current I based on the product of the voltage reference VREF, the capacitance C of the formed capacitor 106, and the frequency of the clock signals Φ1 and Φ2. This current I is proportional to the absolute value of the formed capacitor 106.

Preferably, the capacitor 106 is formed similarly to the capacitor forming the RC time constant of the tunable filter 120 such that any process and/or temperature variations are likely to affect all capacitors substantially equally.

A smoothing filter 223 allows for a smooth current signal to be output from the formed capacitor based tuning reference voltage generator 217.

Figure 4:
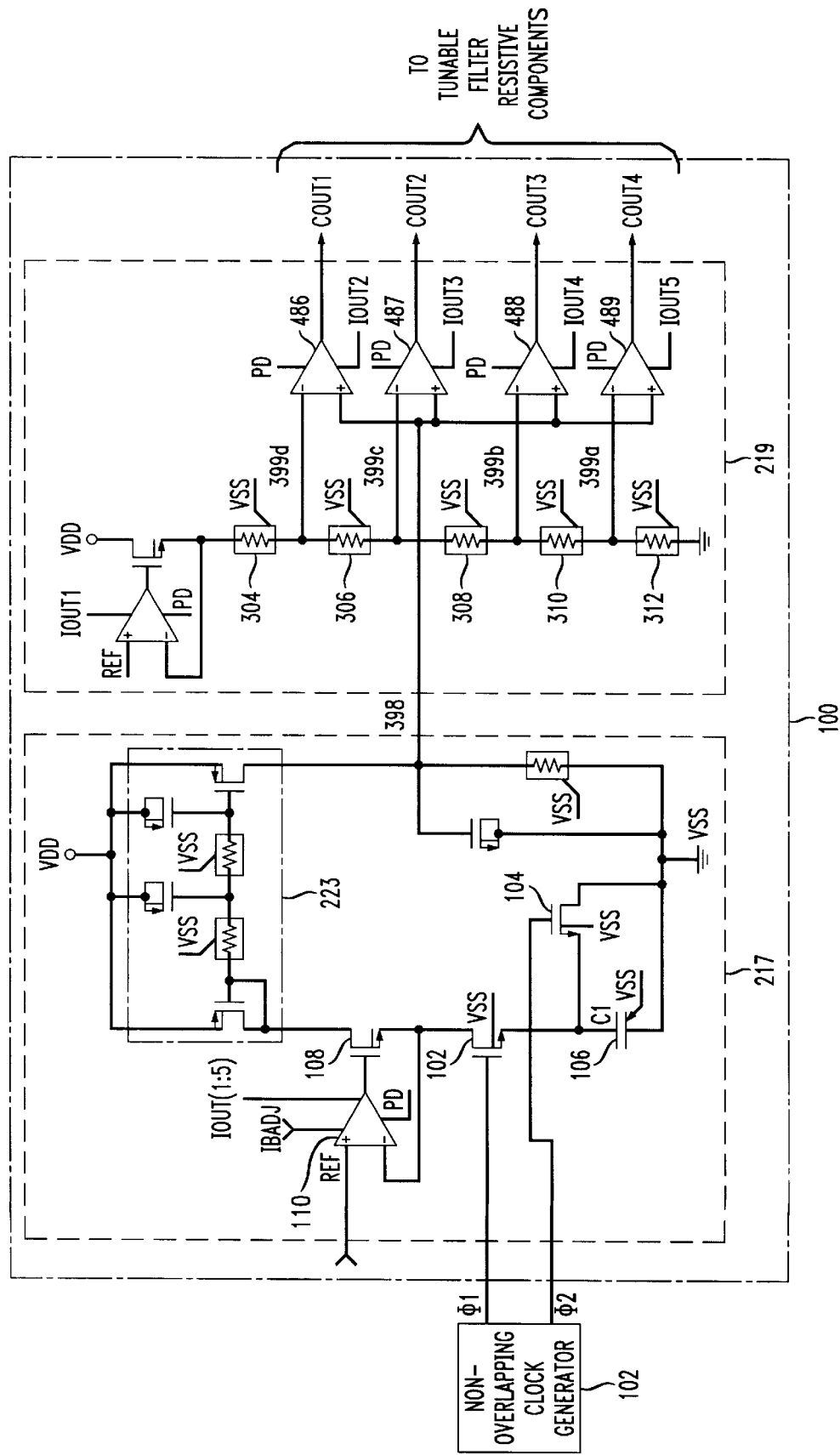
FIG. 4 is a more detailed schematic diagram of the capacitor and resistor based resistor tuning control shown in FIGS. 1 to 3.

FIG. 4 is a schematical depiction of the formed capacitor based tuning reference voltage generator 217 shown in FIG. 3 combined together with a formed resistor based tuning reference voltage generator 219 to provide control signals COUT1 to COUT4. The control signals COUT1 to COUT4 tune an RC time constant by selectably switching individual resistor elements in a tunable resistance component forming an RC time constant in a relevant filter.

In particular, the formed capacitor based tuning reference voltage generator 217 provides a first compensation or reference voltage 398 based on the absolute value of the formed capacitor 106. This first reference voltage 398 is input to the positive inputs of a series of comparators 486–489. The negative inputs for each of the respective comparators 486–489 are connected to sequential nodes in a series combination of a plurality of formed resistor elements 304–312. One end of the series combination of the formed resistor elements 304–312 is tied to ground (e.g., to an analog ground) while the other end of the series combination of the formed resistor elements is provided with the reference voltage VREF.

Preferably, the resistor elements 304–312 are formed substantially similarly to the resistor element relevant to the RC time constant in the tunable filter 120 (FIG. 1) such that any process and/or temperature variations will affect all resistors substantially equally.

The output of the series of comparators 486–489 generates the control signals COUT1 to COUT4, which selectably short individual resistor elements in a tunable resistor relevant to an RC time constant in the tunable filter 120 (FIG. 1).

Figure 5:
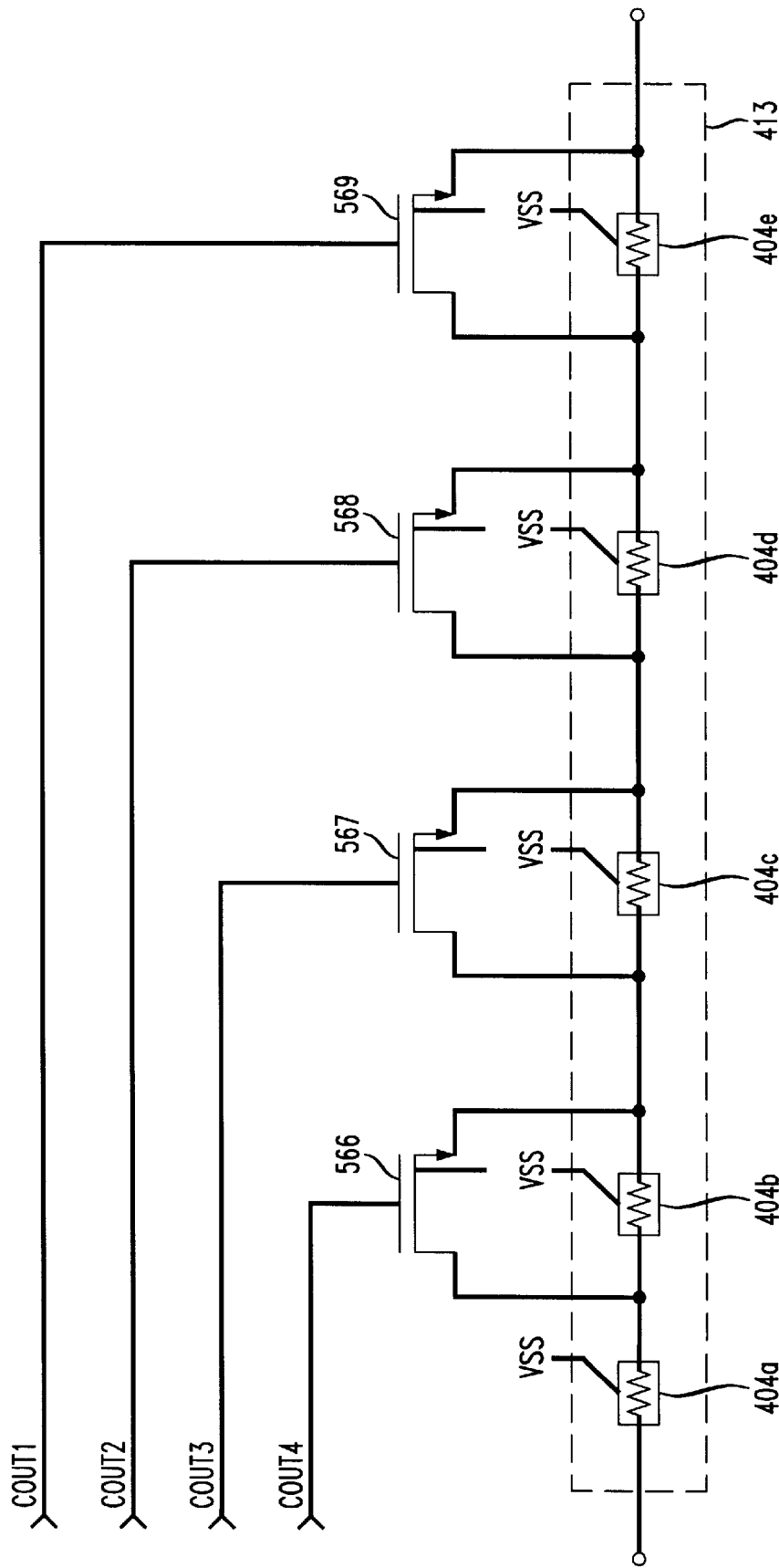
FIG. 5 is an alternative embodiment of the switch wiring of individual resistors in a resistive component forming an RC time constant in a tunable filter, in accordance with another aspect of the present invention.
Figure 6:
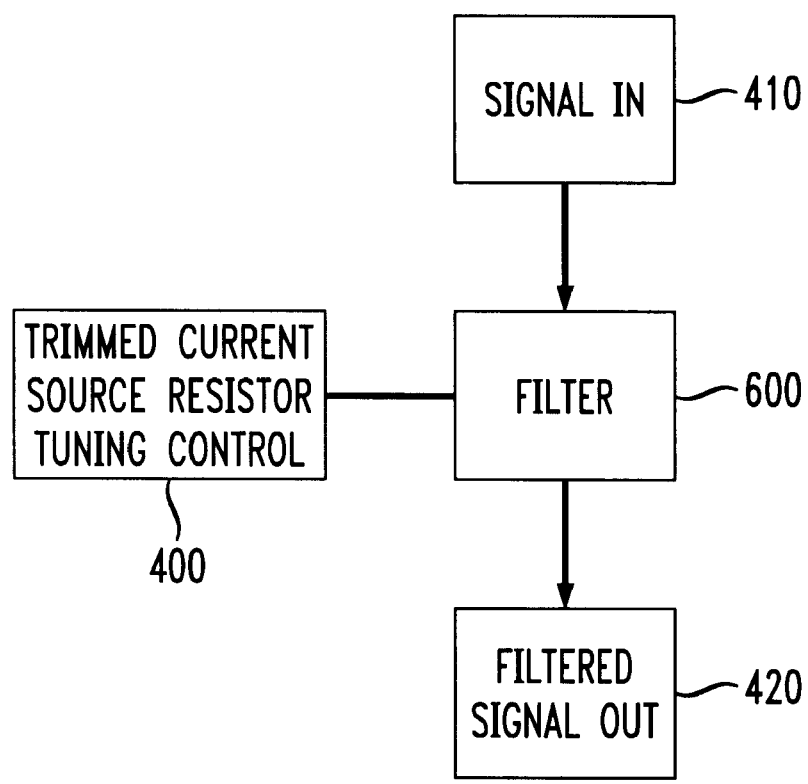
FIGS. 6 to 10 show a conventional resistor based tuning control circuit and tunable filter. In particular.
Figure 7:
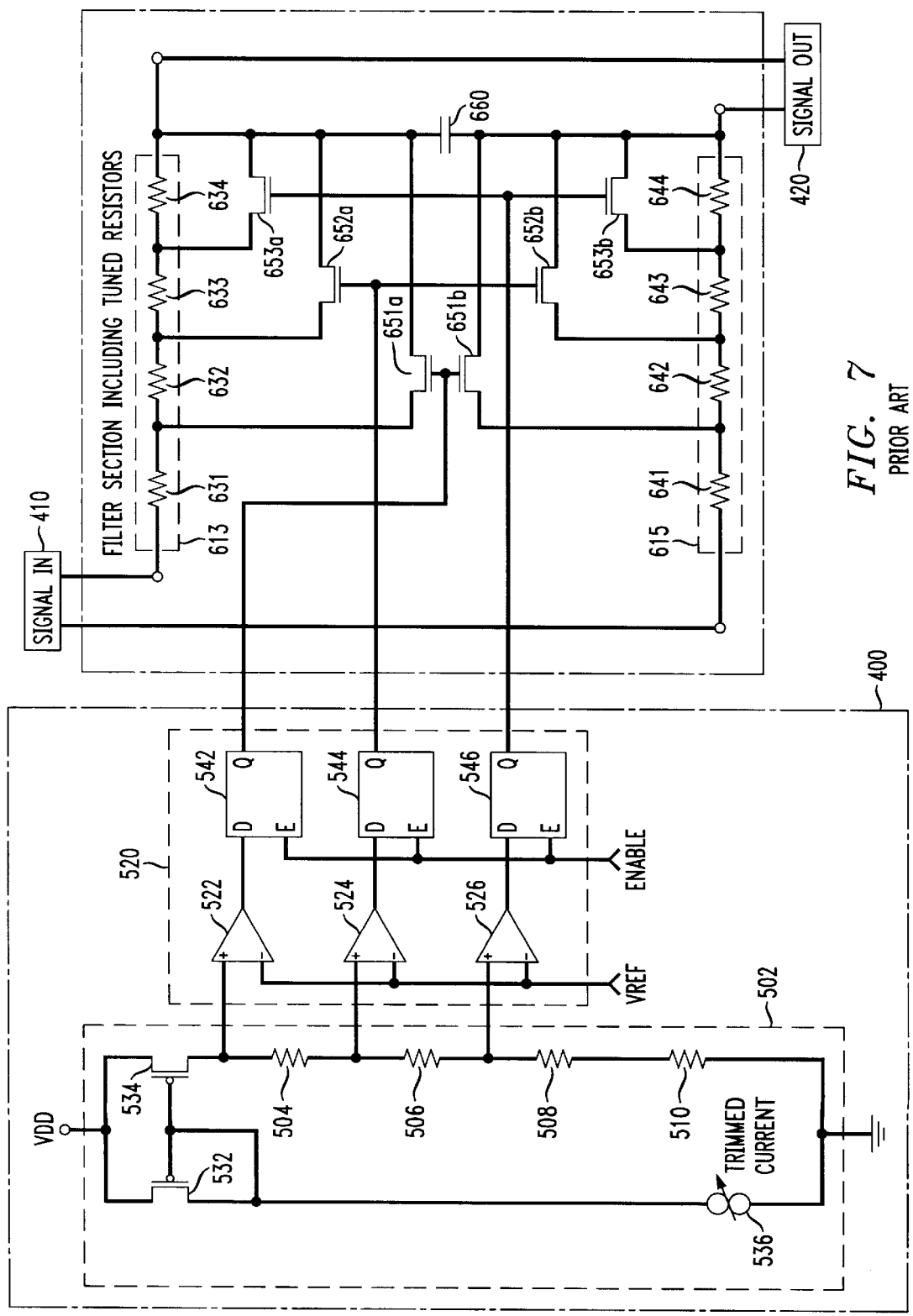
Figure 8:
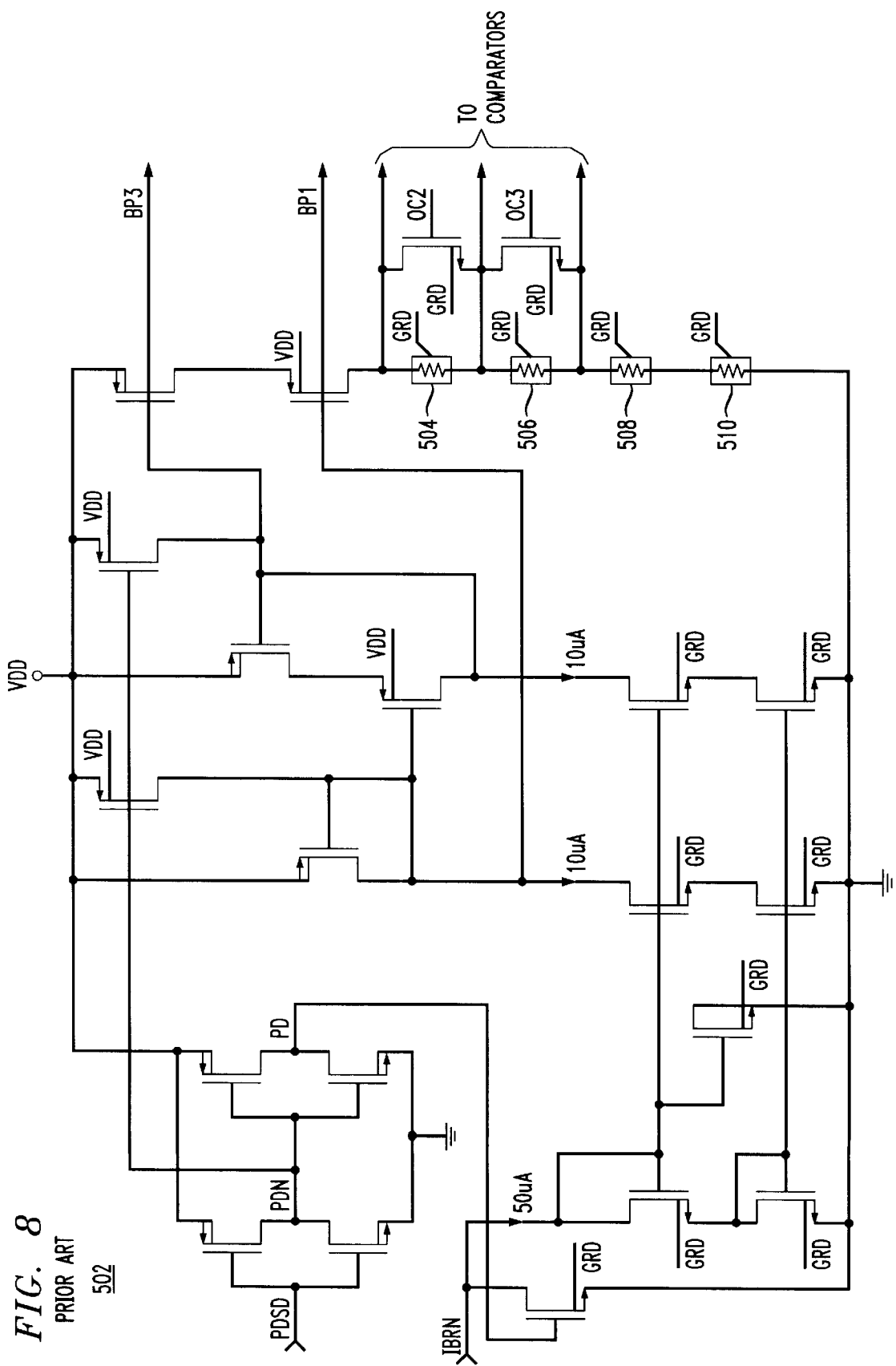
Figure 9:
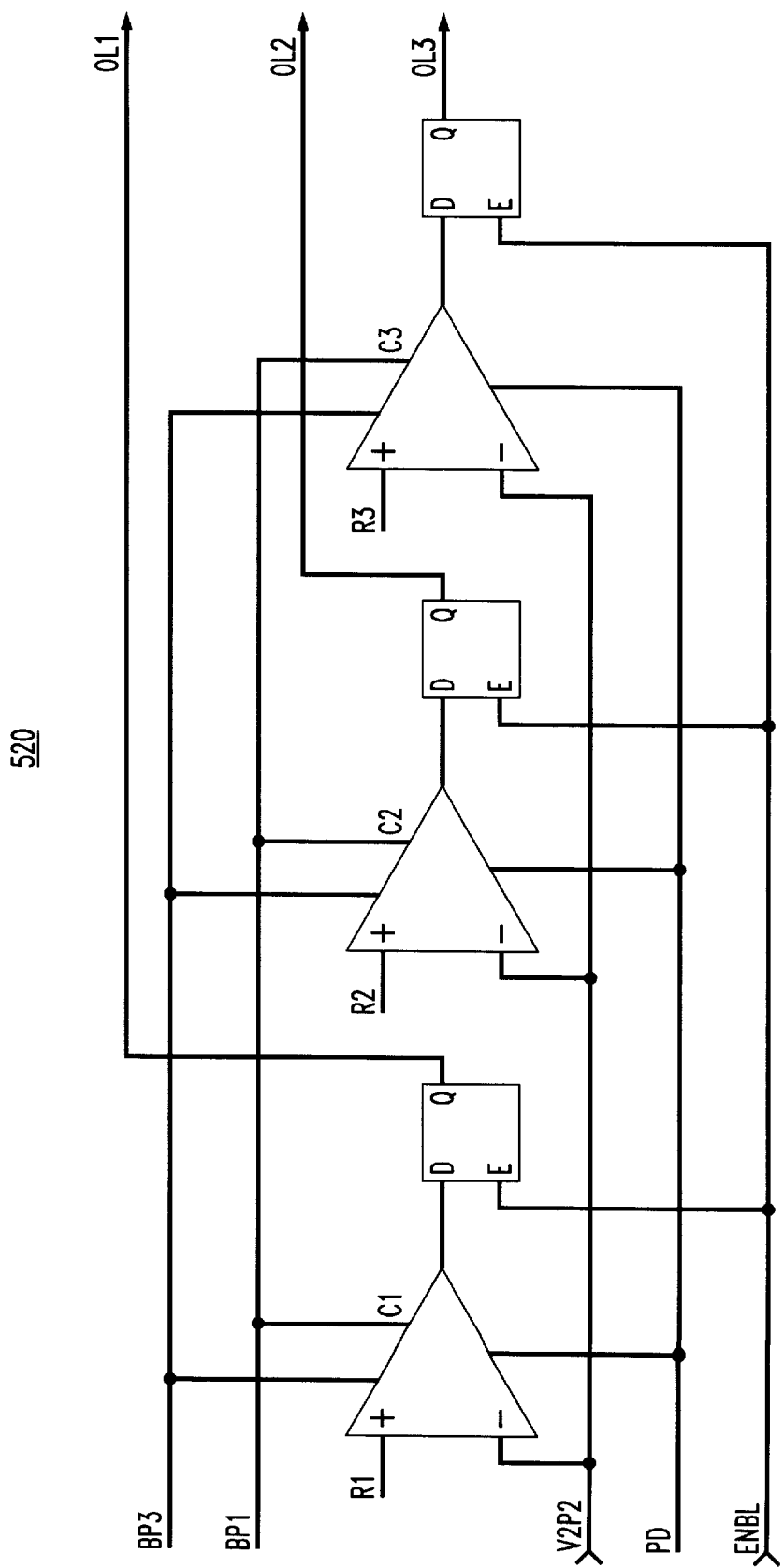
Figure 10:
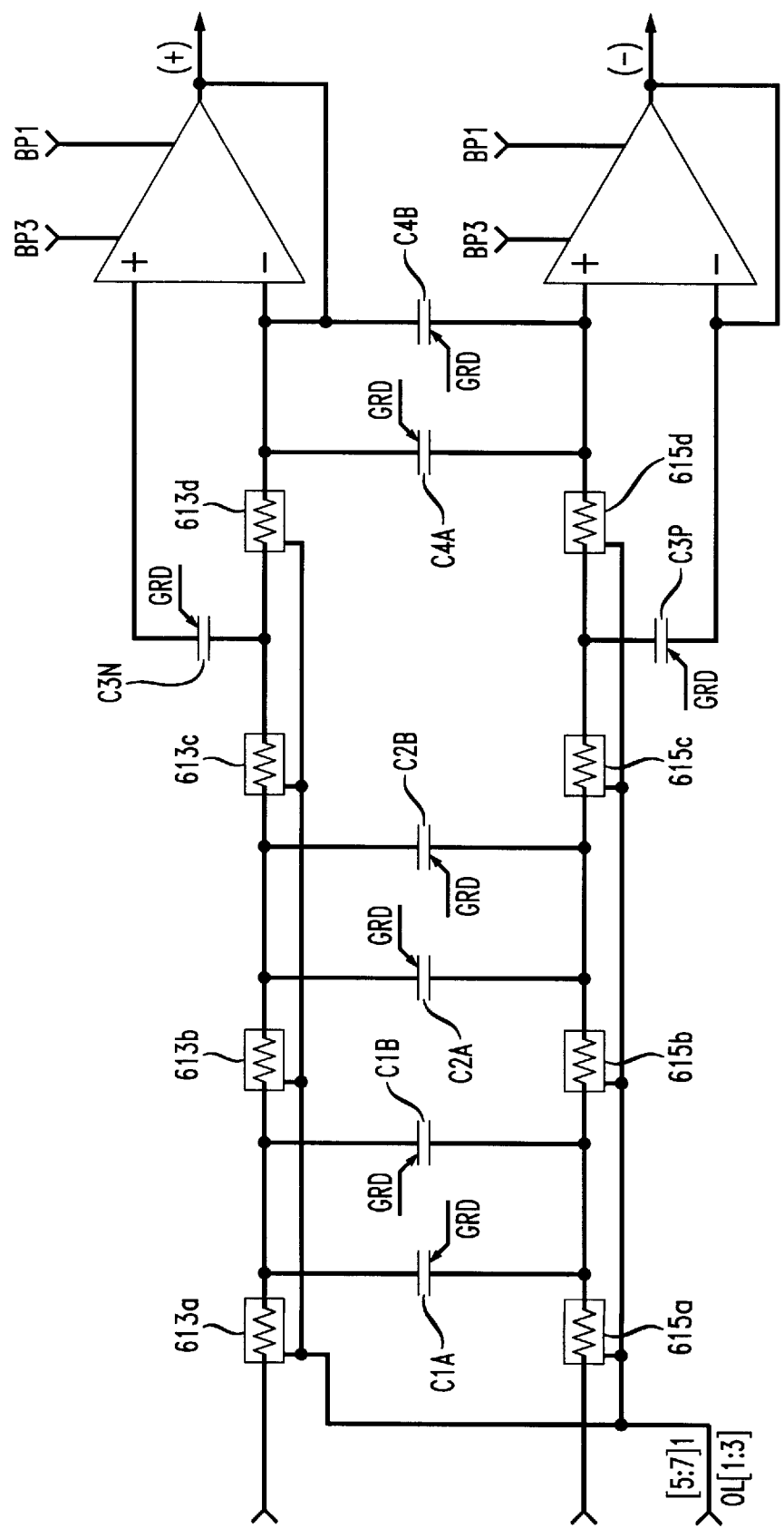
Figure 11:
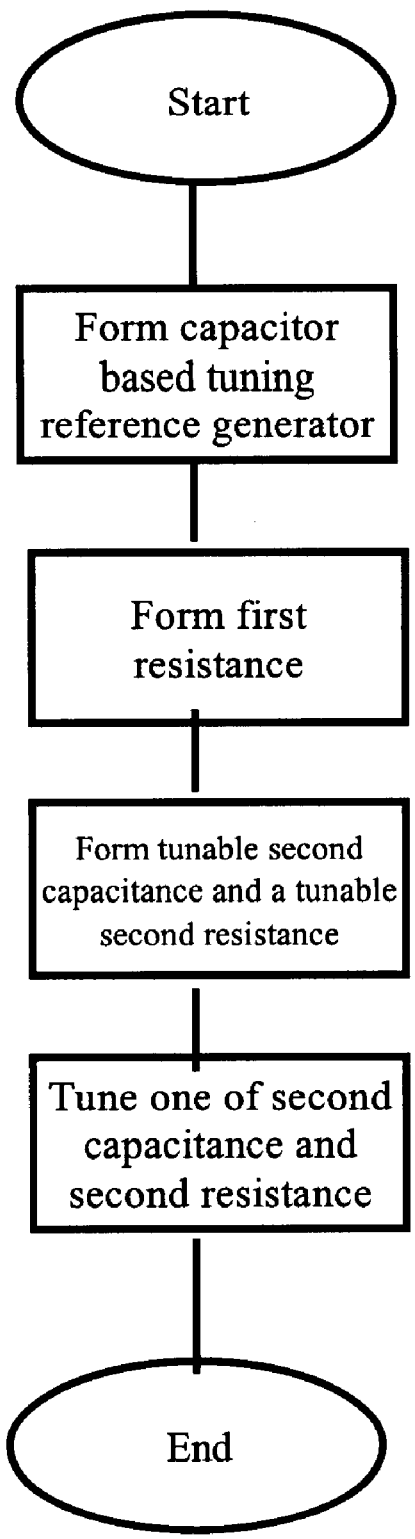
FIG. 11 shows a method of tuning a filter.

FIG. 5 shows an embodiment of a tunable resistive element 413 forming the resistive component of an RC time constant in the tunable filter 120.

In particular, the tuning control signals COUT1 to COUT4 provide switching control to shorting switches (e.g., MOSFETs) 566 to 569. As each switch 566 to 569 is closed, the affected individual resistor 404a–404e is effectively removed from the total resistance of the tunable resistive element 413.

The accuracy of the tuning of the RC time constant relates to several factors, e.g., the number of individual resistors in the resistive components forming the RC constant of the relevant continuous time filter, and to the accuracy of the clock. Thus, while the disclosed embodiments presume resistive components including five individual resistors each, the present invention relates equally to applications utilizing only four resistors 631–634 (and 641–644 in a balanced circuit) as shown with respect to the conventional techniques shown in FIGS. 6 to 10, to applications utilizing fewer than four individual resistors, and to applications utilizing greater than five individual resistors. Moreover, the clock signals Φ1 and Φ2 preferably have an appropriate accuracy of, e.g., less than 1000 parts per million (ppm). However, the particular accuracy desired to provide switching control for the capacitor 106 will be based on the particular application.

The present invention is capable of providing an RC time constant having an a tolerance in the absolute value of +/−15% or less, depending upon the number of individual resistors and corresponding shorting switches used in the tuning portion of the relevant filter.

While the invention has been described with reference to the exemplary embodiments thereof, those skilled in the art will be able to make various modifications to the described embodiments of the invention without departing from the true spirit and scope of the invention.

What is claimed is:

1. A control circuit for a tunable filter, comprising:
   a capacitor based tuning reference generator adapted to provide a capacitor tuning signal;
   a resistor based tuning reference generator adapted to provide a resistor tuning signal; and
   a combining circuit to combine said capacitor tuning signal from said capacitor based tuning reference generator and said resistor tuning signal from said resistor based tuning reference generator to provide at least one control signal to said tunable filter.

2. The control circuit according to claim 1, wherein:
   said capacitor based tuning reference generator generates a reference current.

3. The control circuit according to claim 1, wherein:
   said resistor based tuning reference generator generates a reference voltage.

4. A method of tuning a filter, comprising:
   forming a capacitor based tuning reference generator including a first resistance in said integrated circuit adapted to provide a resistor tuning signal;
   forming a resistor based tuning reference generator including a first resistance in said integrated circuit adapted to provide a resistor tuning signal;
   providing a tunable resistance for said tunable filter;
   combining said capacitor tuning signal with said resistor tuning signal to provide at least one control signal; and
   tuning said resistance based on said control signal.

5. The method of tuning a filter according to claim 4, wherein:
said second resistance is tuned in said step of tuning.
6. The method of tuning a filter according to claim 4, wherein:
said second resistance comprises a series connection of a plurality of individual resistors.
7. The method of tuning a filter according to claim 6, further comprising:
tuning said second resistance by shorting selected ones of said plurality of individual resistors.
8. The method of tuning a filter according to claim 4, wherein:
a multiplicity of resistors are switched into said filter as required under control of said first capacitance.
9. The method of tuning a filter according to claim 4, wherein:
said filter is a continuous time filter.
10. The method of tuning a filter according to claim 9, wherein:
said continuous time filter is an anti-aliasing filter.
11. Apparatus for tuning a filter comprising a capacitance means and a resistance means in combination to form an RC combination, comprising:
capacitor based tuning reference generator means including first capacitance means in an integrated circuit adapted to provide a capacitor tuning signal;
resistor based tuning reference generator means including first resistance means formed in said integrated circuit adapted to provide a resistor tuning signal; and
means for combining said capacitor tuning signal with said resistor tuning signal to tune said resistance means.
12. The apparatus for tuning a filter according to claim 11, wherein:
said second resistance means is tuned by said means for tuning.
13. The apparatus for tuning a filter according to claim 11, wherein:
said second resistance means comprises a series connection of a plurality of individual resistors.
14. The apparatus for tuning a filter according to claim 13, further comprising:
tuning said second resistance means by shorting selected ones of said plurality of individual resistors.
15. The apparatus for tuning a filter according to claim 11, wherein:
said filter is a continuous time filter.
16. The apparatus for tuning a filter according to claim 15, wherein:
said continuous time filter is an anti-aliasing filter.
17. The method of tuning a filter according to claim 11, wherein:
a multiplicity of capacitors are switched into said filter as required under control of said first capacitance.
18. A control circuit for a filter, comprising:
a capacitor based tuning reference generator;
a resistor based tuning reference generator;
a combining circuit to combine reference signals output from said capacitor based tuning reference generator and said resistor based tuning reference generator to provide at least one control signal to said filter; and
a non-overlapping clock generator for generating opposite phases of a clock signal, said opposite phases of said clock signal being input to said capacitor based tuning reference generator.

19. A control circuit for a tunable filter in an integrated circuit, comprising:
a capacitor based tuning reference generator adapted to provide a capacitor tuning signal;
a resistor based tuning reference generator adapted to provide a resistor tuning signal;
a combining circuit to combine said capacitor tuning signal from said capacitor based tuning reference generator and said resistor tuning signal of said resistor based tuning reference generator to provide at least one control signal to said tunable filter; and wherein said capacitor based tuning reference comprises:
a capacitor coupled to a control circuit;
a first switching circuit coupled to said capacitor to charge said capacitor based on a first control signal; and
a second switching circuit coupled to said capacitor to discharge said capacitor based on a second control signal.
20. The control circuit according to claim 19, further comprising:
two clock signals adapted to respectively operate said first switching circuit and said second switching circuit in opposite phases.
21. The control circuit according to claim 19, further comprising:
a smoothing filter coupled to said capacitor to smooth a said capacitor based tuning reference generator output signal from said capacitor based tuning reference generator.
22. A control circuit for a filter, comprising:
a capacitor based tuning reference generator adapted to provide a capacitor tuning signal;
a resistor based tuning reference generator comprising a plurality of resistor connected in series of modes adapted to provide a resistor tuning signal; and
a plurality of combining circuits, each combining a respective output signal from said nodes between said plurality of series connected resistors with said capacitor tuning signal from said capacitor based tuning reference generator to provide a respective control signal to control said filter.
23. The control circuit according to claim 22, wherein:
said series connected resistors are formed in an integrated circuit including said control circuit.
24. The control circuit according to claim 23, wherein:
said plurality of combining circuits include a plurality of comparators.
25. The control circuit according to claim 23, wherein:
respective positive nodes of said plurality of comparators are connected to said output from said capacitor based tuning reference generator; and
respective negative nodes of said plurality of comparators are connected to said nodes between said plurality of series connected resistors.
26. A method of tuning a filter having a resistance in combination with a capacitance to form an RC combination, comprising:
forming a capacitor based tuning reference generator including a first capacitance generating a first capacitance signal in an integrated circuit;
forming a first resistance in said integrated circuit generating a first resistance signal;
forming a second resistance in combination to form an RC combination;

tuning said second resistance based on a signal from said first capacitance signal and said first resistance signal;

generating opposite phases of a clock signal; and inputting said plurality of clock signals to said capacitor based tuning reference generator.

27. A method of tuning an RC tunable filter, comprising:

forming a capacitor based tuning reference generator comprising a capacitor formed in an integrated circuit, a first switching circuit adapted to charge said capacitor, and a second switching circuit adapted to discharge said capacitor, producing a capacitor signal;

forming a first resistance in said integrated circuit producing a first resistance signal;

forming a second resistance to form said RC tunable filter; and tuning said second resistance based on said capacitor signal and said first resistance signal.

28. A method of tuning an RC filter, comprising:

forming a capacitor based tuning reference generator comprising a capacitor formed in an integrated circuit, a first switching circuit adapted to charge said capacitor, and a second switching circuit adapted to discharge said capacitor, producing a capacitor signal;

forming a first resistance in said integrated circuit producing a first resistance signal;

forming a second capacitance and a second resistance in combination to form an RC combination;

tuning one of said second capacitance and said second resistance based on said capacitance or signal and said first resistance signal; and providing two clock signals adapted to respectively operate said first switching circuit and said second switching circuit in opposite phases.

29. A method of tuning an RC filter, comprising:

forming a capacitor based tuning reference generator comprising a capacitor formed in an integrated circuit, a first switching circuit adapted to charge said capacitor, and a second switching circuit adapted to discharge said capacitor, producing a capacitor signal;

forming a first resistance in said integrated circuit producing a first resistance signal;

forming a second capacitance and a second resistance in combination to form an RC combination;

tuning one of said second capacitance and said second resistance based on said capacitance or signal and said first resistance signal; and smoothing a capacitor based tuning reference generator output signal from said capacitor based tuning reference generator.

30. A method of tuning an RC filter, comprising:

forming a capacitor based tuning reference generator including a first capacitance in an integrated circuit;

forming a resistor based tuning reference generator comprising a plurality of series connected resistors, and a plurality of combining circuits to combine output signals from nodes between said plurality of series connected resistors with a capacitor based tuning reference generator signal output from said capacitor based tuning reference generator;

forming first a resistance in said resistor based tuning reference generator, generating a first resistance signal;

forming a tunable second resistance to form an RC time constant;

tuning said second resistance based on said first resistance signal from said first resistance.

31. The method according to claim 30, wherein:

said series connected resistors are formed in an integrated circuit including said control circuit.

32. The method according to claim 30, wherein:

said plurality of combining circuits include a plurality of comparators.

33. The method according to claim 30, wherein:

respective positive nodes of said plurality of comparators are connected to said output from said capacitor based tuning reference generator; and respective negative nodes of said plurality of comparators are connected to said nodes between said plurality of series connected resistors.

34. An apparatus for tuning an RC filter, comprising:

capacitor based tuning reference generator means including first capacitance means in an integrated circuit producing a capacitor signal;

first resistance means formed in said integrated circuit producing a first resistance signal;

tunable second capacitance means and tunable second resistance means in combination to form an RC time constant;

means for tuning one of said second capacitance means and said second resistance means based on said signal from said first capacitance means and said signal from said first resistance means; and non-overlapping clock generator means for generating opposite phases of a clock signal, said opposite phases of said clock signal being input to said capacitor based tuning reference generator means.

35. An apparatus for tuning an RC filter, comprising:

capacitor based tuning reference generator means including first capacitance means in an integrated circuit producing a capacitor signal;

first resistance means formed in said integrated circuit producing a first resistance signal;

second capacitance means and second resistance means in combination to form an RC combination;

means for tuning one of said second capacitance means and said second resistance means based on said capacitance or signal means and said first resistance signal;

first switching circuit means adapted to charge said first capacitance means; and second switching circuit means adapted to discharge said first capacitance means.

* * * * *